128-24 A AU 337 EX
4/22/86 OR 4,583,529

United States Patent [19]
Briggs

[11] Patent Number: 4,583,529
[45] Date of Patent: Apr. 22, 1986

[54] HIGH EFFICIENCY HIGH FREQUENCY POWER OSCILLATOR

[75] Inventor: James B. Briggs, La Canada, Calif.

[73] Assignee: Mettler Electronics Corporation, Anaheim, Calif.

[21] Appl. No.: 496,838

[22] Filed: May 23, 1983

[51] Int. Cl.[4] ...................... A61H 23/00; A61H 23/02; H03F 3/26

[52] U.S. Cl. ................................ 128/24 A; 128/24.1; 330/271

[58] Field of Search ...................... 128/24 A, 24.1, 32, 128/41, 422; 433/86, 73, 119; 330/271, 265; 73/DIG. 4; 310/317, 116; 363/22, 23; 331/113 R

[56] References Cited

U.S. PATENT DOCUMENTS

| | | | |
|---|---|---|---|
| 2,876,764 | 3/1959 | Güttner et al. | 128/24 A |
| 2,963,680 | 12/1960 | Beebe | 310/317 |
| 3,156,877 | 11/1964 | Merkel . | |
| 3,421,099 | 1/1969 | O'Malley | 330/271 |
| 3,432,691 | 3/1969 | Shoh | 310/8.1 |
| 3,571,644 | 3/1971 | Jakoubovitch . | |
| 3,743,868 | 7/1973 | Kawada . | |
| 3,955,545 | 5/1976 | Priegel . | |

OTHER PUBLICATIONS

RCA's Designer's Handbook entitled "Solid-State Power Circuits", Technical Series SP-52, 1971, pp. 300-305 and 615-621.

*Primary Examiner*—Richard J. Apley
*Assistant Examiner*—Kathleen D'Arrigo
*Attorney, Agent, or Firm*—Christie, Parker & Hale

[57] ABSTRACT

The invention relates to a high frequency, high mechanical energy output apparatus comprising a transducer, a filter circuit, and a driving circuit. The transducer and the filter circuit are serially coupled together, and the transducer operates at its fundamental frequency of oscillatory motion. The driving circuit serves to drive the transducer at its fundamental frequency and comprises first and second active devices, wherein each active device has an output circuit and a control circuit. Each of the active devices are cooperatively connected together and are responsive to control signals for producing an alternating output signal. There is also provided means coupling the output circuits of the active devices to the transducer so that an alternating series current signal is applied serially through the transducer. The filter circuit filters from the alternating series current signal substantially all harmonics of the fundamental frequency of oscillation of the transducer to produce a filtered series current signal. There is also provided means for coupling the filtered series current signal to the control circuits of the active devices such that the filtered series current signal constitutes the control signal for controlling each of the first and second active devices for producing an output signal from the driving circuit substantially at the fundamental frequency.

30 Claims, 6 Drawing Figures

HIGH EFFICIENCY HIGH FREQUENCY POWER OSCILLATOR

BACKGROUND OF THE INVENTION

1. Field of the Invention

This invention relates to high frequency high efficiency power oscillators and more specifically to ultrasonic devices having a self-excited oscillator employing a push-pull driving circuit for producing a high frequency output from a transducer.

2. Description of the Prior Art

There are many types of oscillator circuits known in the art, many of which are specifically designed for driving a transducer, for example, a piezoelectric crystal for producing ultrasonic waves. The RCA Designer's Handbook entitled Solid-State Power Circuits, copyright 1971 by RCA Corporation, and printed in the United States in September, 1971, describes basic circuits designed for driving transducers at ultrasonic frequencies.

Beginning at page 302, the Handbook describes the basic operating characteristics of push-pull oscillator circuits. At page 616, a dual transistor push-pull oscillating circuit is described for driving a transducer that forms part of a series-tuned load circuit. However, as the operating frequency of the push-pull oscillator in FIG. 703 is determined by the feedback from the primary windings of the output transformer, variations in the fundamental frequency of the transducer is not followed by similar changes in the operating frequency of the push-pull circuit.

Another form of oscillator circuit for driving a transducer is described in Shoh, U.S. Pat. No. 3,432,691. Shoh discloses a dual switching transistor oscillator circuit for driving an electro-acoustic converter at parallel resonance. The circuit is designed such that the power dissipated in the converter remains substantially constant while the power transferred to the load may vary over wide limits. This is done substantially by inserting an inductor in series with the output of the switching transistors such that the capacitive reactance of the electro-acoustic converter is exactly matched by the inductive reactance of the series inductor. As a result, the voltage signal placed across the load is a sine wave and is applied effectively to the pure resistive component of the converter. Furthermore, both the total power input and the power delivered to the load vary in a like manner by following the changes in the mechanical resistance of the converter. However, the Shoh design does not optimize the efficiency of the oscillator circuit driving the converter. It appears that Shoh fails to provide base drive amplitude to the transistors proportional to the amplitude of the signal driving the converter. As a result, the transistors operate in the switching mode under low power requirements the same as they operate under high power requirements.

An amplifier for driving piezoelectric ceramics is shown in Kawada, U.S. Pat. No. 3,743,868. Kawada shows series feedback from a crystal driven by a single transistor amplifier circuit. Kawada does not operate at optimum efficiency as there appears to be failure to eliminate any high frequency harmonics of the fundamental frequency of the crystal from the feedback. Furthermore, Kawada does not provide current feedback to the amplifier input proportional to the load current.

SUMMARY OF THE INVENTION

The present invention overcomes one or more of the deficiencies of the prior art. Briefly, a preferred embodiment of the present invention is a high frequency, high mechanical energy output apparatus. It includes a transducer and a filter circuit serially coupled together. A driving circuit drives the transducer at its series resonant frequency and comprises first and second active devices. Each active device has an output circuit and a control circuit. Each of the active devices is cooperatively connected together and responsive to control signals for producing an alternating output signal. The output circuits of the active devices are coupled to the transducer for applying an alternating series current signal serially through the transducer. The filter circuit filters from the series current signal substantially all harmonics of the fundamental frequency of oscillation of the transducer to produce a filtered series current signal at the series resonant frequency. The series current signal is coupled to the first and second active devices for controlling the active devices, causing them to produce an output signal from the driving circuit substantially at the fundamental frequency.

With such an arrangement, it is now possible to minimize the power dissipation in the active devices. As a result, low cost transistors which normally operate at low frequencies may be used for the active devices, thereby minimizing cost. Additionally, since the series current flowing through the transducer is fed back to the active devices and the current in the control circuits is proportional to the series current, any changes in amplitude of the current flowing through the transducer, such as by loading of the transducer, will cause a corresponding change in amplitude of the signal fed back to the active devices, thereby causing the active devices to supply just that magnitude of signal required to maintain the operation of the transducer at the proper level.

Preferably, the apparatus is embodied in a high energy output ultrasonic patient therapy apparatus where the vibratory energy from the transducer is applied to the surface of a human body. In such a device, substantial loading occurs when the transducer is applied to the patient's body and series feedback signal from the transducer is of importance in maintaining the driving signal for the transducer at the proper level and phase for patient treatment.

In the present embodiment, the efficiency is a maximum for any load since the frequency of the feedback signal is tied to the load. Similarly, if the series resonant frequency of the crystal changes with a change in crystal loading, the frequency at which the driving circuit operates will change in like manner.

In one form of the invention, the series current flowing through the transducer is stepped down before it is fed back to the active devices. The current signal fed back to the active devices is therefore still proportional to the series current flowing through the transducer but is of an amplitude only large enough to maintain the operation of the active devices. Efficiency is thereby enhanced.

DESCRIPTION OF THE PREFERRED EMBODIMENT

Figure 1:
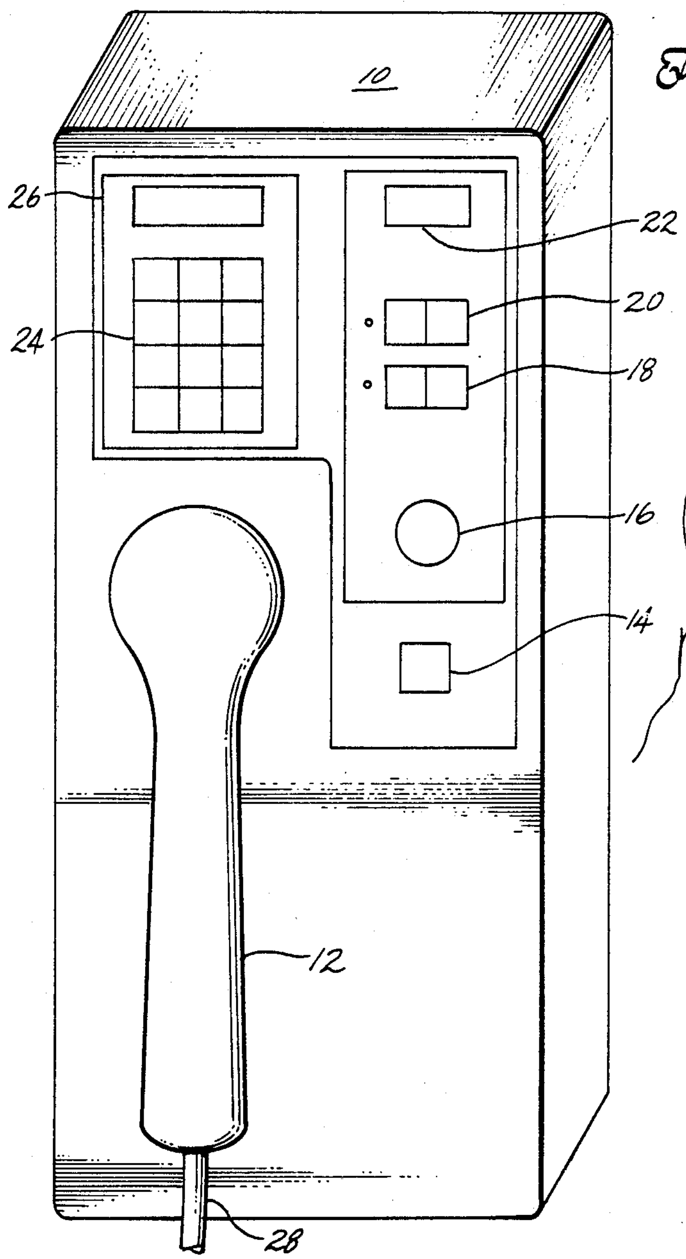
FIG. 1 is a perspective view of an ultrasonic therapy device and one embodying the present invention.

FIG. 1 shows an ultrasonic therapy device 10 preferably in a compact, lightweight case, i.e. plastic, with a hand held ultrasonic applicator 12 and embodying the present invention. The ultrasonic therapy device is controlled with an ON-OFF switch in the form of main power control 14 and the output of the ultrasonic therapy device 10 is controlled by a variable power level control 16. Both controls are conveniently placed on the front panel of the device 10. A power mode selector 18 selects the type of ultrasonic power to be applied during therapy. For example, the output may be in constant wave form or in a pulsed wave form.

A power indicator selector 20 and a power output indictor 22 allows a technician to select with the power indicator selector 20 the power mode to be displayed on the power output indicator 22. For example, the power indicator may display power output in watts or in watts per square centimeter in a Light Emitting Diode display.

A treatment time selector 24 permits a technician to vary the time of treatment to which a patient is exposed for therapy. Treatment time indicator 26 indicates the remaining time of therapy.

Figure 2:
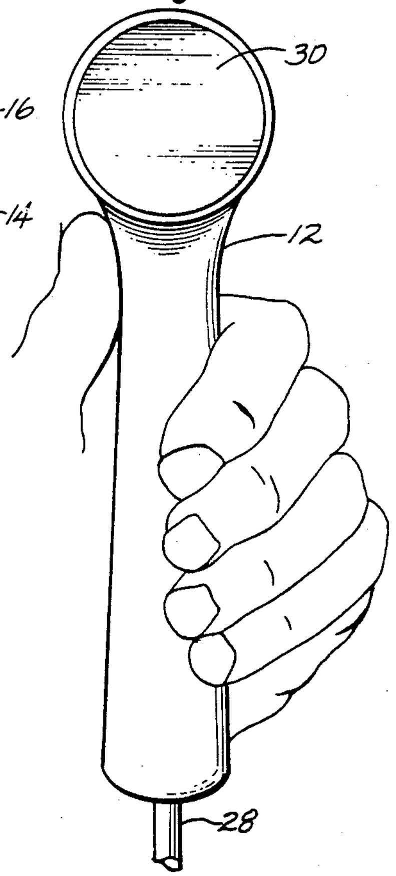
FIG. 2 is an elevation view of an applicator associated with the ultrasonic therapy device of FIG. 1.

FIG. 2 shows a close-up of the ultrasonic applicator 12 of FIG. 1 in a frontal view. High frequency current signals are supplied from a drive circuit in the ultrasound therapy device 10 to a transducer, for example, a piezoelectric crystal 30, shown in FIG. 2. The piezoelectric crystal is encased in an insulating cover (not shown) in order to protect the crystal from the external atmosphere and the patient from the electrical power applied to the crystal. The crystal is fixed in the ultrasonic applicator 12 by conventional means such as cement or epoxy (not shown).

Figure 3:
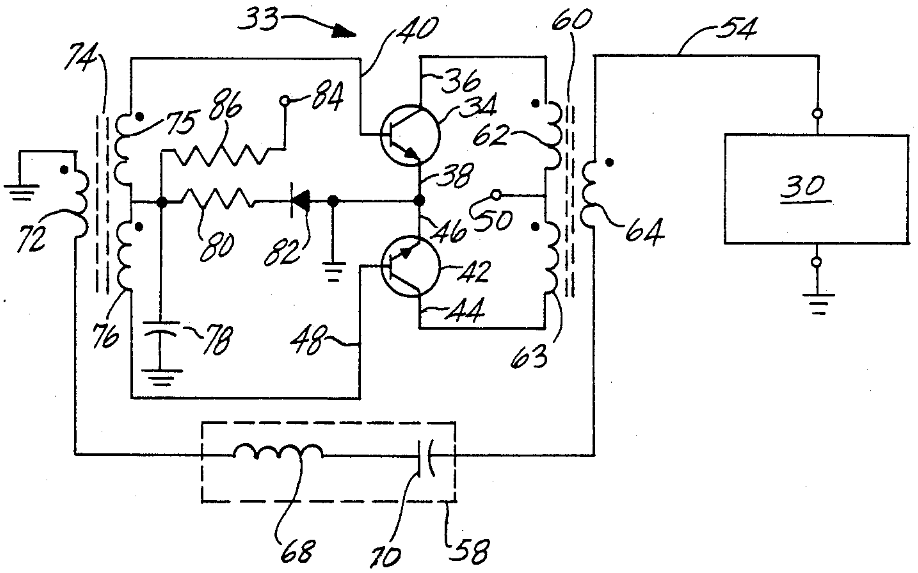
FIG. 3 is a schematic diagram of a simplified oscillator circuit for use in the ultrasonic therapy device of FIG. 1.

FIG. 3 shows a schematic diagram of a simplified version of the electrical circuit including the crystal in the ultrasonic therapy device of FIG. 1 and embodies the present invention. A push-pull drive circuit 33 is disclosed and comprises first and second active devices, for example, a first transistor 34 having a collector circuit 36, an emitter circuit 38 and a base circuit 40 and a second transistor 42 similarly having a collector circuit 44, an emitter circuit 46 and a base circuit 48. The base circuit of each transistor comprises a control circuit of the active device and the collector to emitter circuits of each transistor comprises an input-output circuit, or more simply, an output circuit of the active device. The transistors shown in the present embodiment are preferably low cost, low frequency NPN type transistors. It is to be understood that other active devices are possible with the concepts disclosed with respect to the present invention. For example, one skilled in the art could easily manipulate the circuit so that PNP transistors can be used as the active devices. Furthermore, one skilled in the art, with the aid of the concepts disclosed, could construct a suitable circuit using voltage-dependent Field Effect Transistors.

The first and second transistors are cooperatively connected together in a conventional push-pull relationship so that each operates 180° out of phase with the other for producing an alternating output signal. A positive transistor power supply 50 is coupled to the collector circuit 36 of the first transistor 34 and to the collector circuit 44 of the second transistor 42 through primary windings 62 and 63, respectively, of an output transformer 60. The emitter circuit 38 of the of the first transistor 34 and the emitter circuit 46 of the second transistor 42 are connected together at ground (0 volts) potential.

Drive circuit 33 is coupled to crystal 30, for driving the crystal 30 at its series resonant frequency, where the crystal forms part of a load circuit 54 and a filter circuit 58. Crystal 30 and filter circuit 58 are coupled together in series so that a series current signal is conducted through both circuits.

The output transformer 60 comprises means for coupling the collector circuits 36 and 44 to the crystal 30 for applying an alternating series current signal serially through the crystal. To this end, the output transformer has a secondary winding 64 connected in series with the crystal and is also connected in series with the filter circuit 58. As a result, the output of the drive circuit 33 drives a series current signal through secondary winding 64, crystal 30 and filter circuit 58.

The polarity of the primary and secondary windings of output transformer 64 are such that current flowing in winding 62 due to current flow in transistor 34 causes current to flow in one direction in secondary winding 64, whereas current flow in primary winding 63 due to current flow in transistor 42 causes current to flow in the opposite direction in secondary winding 64.

The filter circuit 58 comprises serially connected feedback filter inductor 68 and feedback filter capacitor 70. The filter circuit 58 is a band pass filter serving to filter out substantially all but the fundamental frequency of oscillation of crystal 30. The filter circuit 58 serves as a high impedance to the higher harmonic frequencies of the fundamental frequency and to signals of significantly lower frequency. As a result, the square wave voltage output of the driving circuit 33, is filtered so that a substantially sinusoidal current signal in the form of a filtered series current signal flows in the series connected crystal and filter circuit. It should be noted that the filter circuit can be just as effectively placed serially in the load circuit 54 between crystal 30 and secondary winding 64.

A feedback transformer 74 forms means for coupling the filtered series current signal flowing in the series coupled crystal and filter circuit back to the base circuit 40 of the first transistor 34 and the base circuit 48 of the second transistor 42. In this fashion, the transistors are cooperatively coupled together and responsive to control signals comprising the filtered series current signal. The feedback transformer 74 comprises a primary winding 72 connected in series with the series coupled crystal, filter circuit and secondary winding 64, one end of the primary winding being connected to ground and the other to one end of the filter circuit. The feedback transformer also comprises secondary windings 75 and 76 having one end of each connected together and coupled to ground through a capacitor 78, a second end of secondary winding 75 is connected to the base circuit 40 of transistor 34 and a second end of secondary winding 76 is connected to base circuit 48 of transistor 42. The common junction of secondary windings 75 and 76 is connected to a first startup resistor 80 and the cathode electrode of a startup diode 82, where the anode electrode of diode 82 is connected to ground.

Base startup power supply 84 is connected through a second startup resistor 86 to the common junction of secondary windings 75 and 76. The primary and secondary windings of feedback transformer 74 are poled such that the signal in each secondary winding is 180° out of phase with the signal in the other secondary winding. As a result, current is being driven into the base circuit of one transistor so as to turn that transistor ON while current is driven in the opposite direction in the base circuit of the other transistor so as to turn the other transistor OFF. Thus, one transistor is in an OFF mode while the other is in an ON mode.

It is also preferable that the output transformer 60 and feedback transformer 74 operate in their linear range. The advantage of this limitation is that power loss is decreased and efficiency is enhanced.

The preferred embodiment also contemplates a primary to secondary windings ratio in feedback transformer 74 such that the feedback signal from the primary windings to the secondary windings is stepped down to a point where the amplitude of the current applied to the base circuit of a given transistor is a minimum while still maintaining the proper driving requirement for the transistor. This also serves to minimize the impedance presented to the current flowing in the load circuit 54 by the primary winding 72 of feedback transformer 74.

Figure 4:
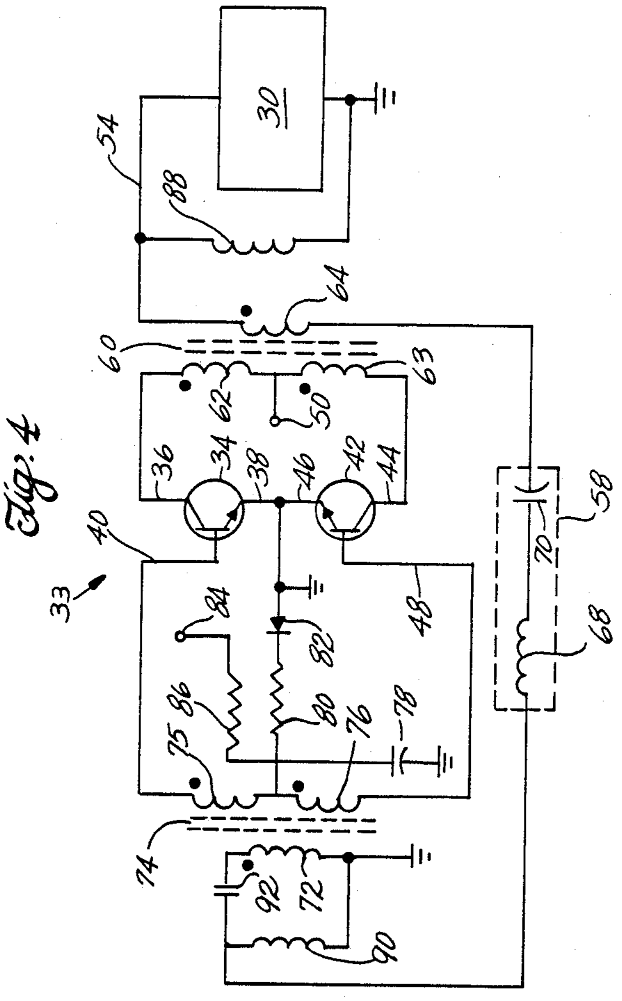
FIG. 4 is a detailed schematic of the electrical circuit for use in the ultrasonic therapy device of FIG. 1.

FIG. 4 shows a push-pull oscillator circuit similar to that shown in FIG. 3 with several additional features. The common elements are numbered the same as in FIG. 3 with the additional elements as hereinbelow identified and described. Specifically, a reactance cancelling inductor 88, discussed below, is connected in parallel with the crystal 30. Furthermore, a phase shifting inductor 90 and a phase shifting capacitor 92 are connected in parallel and in series, respectively, with the feedback primary winding 72 of the feedback transformer 74. These phase shifting elements serve to advance the phase of the feedback signal to compensate for lag in transistor switching.

With the construction of the circuit of FIGS. 3 and 4 in mind, consider now the operation. The transistors 34 and 42 alternately switch ON to conduct current through the appropriate collector-emitter circuit and OFF by inhibiting the flow of such current. When transistor 34 is on, current flows from the positive transistor power supply 50 through primary winding 62 to ground, thereby inducing current flow in the secondary winding 64. Subsequently, when transistor 34 switches off and transistor switches 42 on, current flows through primary winding 63, thereby inducing current in the secondary winding 64 in the opposite direction. The current flow in the secondary winding 64 flows serially through the circuit including the crystal 30, the filter circuit 58 and the primary winding 72. The filter circuit 58, as described above, filters out substantially all but the fundamental frequency of oscillation for the crystal 30, thereby producing substantially a pure sinusoidal wave form in the series current signal. In more detail, the series current flowing in load circuit 54 is applied most effectively to the crystal because the inductor 88 serves to cancel the capacitive reactance inherent in the construction of the applicator 12 and in the conductor 28, i.e., shunt capacitance. However, currents at the harmonic frequency will still flow in the effective shunt capacitance of the crystal were it not for filter circuit 58.

The filtered series current signal flowing in the primary winding 72 is then fed to the secondary windings 75 and 76. Current flowing in one direction in primary winding 72 causes current to flow in secondary winding 75 so as to drive current into the base of transistor 34, switching it ON. Current flowing in the opposite direction in primary winding 72 causes current to flow in secondary winding 76 so as to switch transistor 42 ON.

Although different values may be selected and still be within the scope of the present invention by those skilled in the art, Table I at the end of this application shows typical circuit values for the various components. For example, filter capacitor 70 is preferably a pair of parallel capacitors (not shown), one of which is 1500 picoFarad and the other of which is a variable capacitor from 50–600 picoFarad set at the factory. Phase shifting inductor is very small and is chosen to achieve its stated purpose, as is well known in the art.

Figure 5:
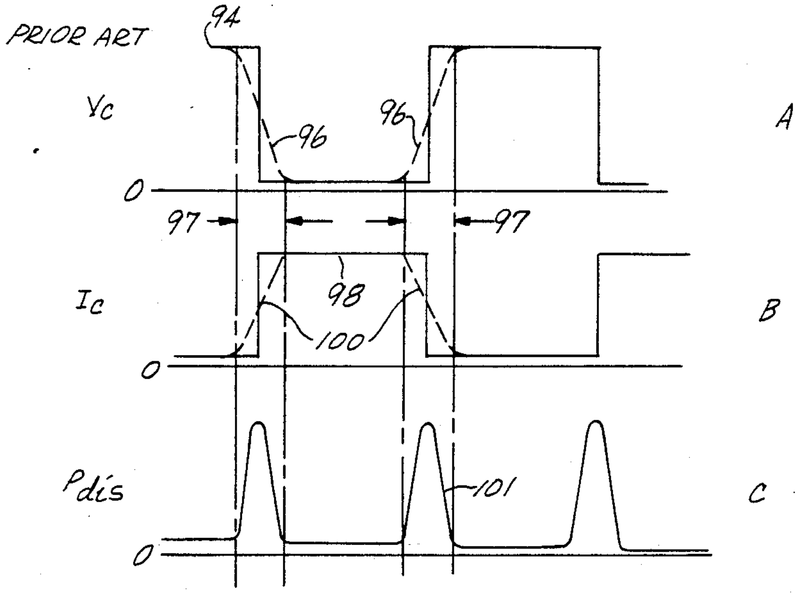
FIG. 5 is a wave form diagram of typical voltage, current and power dissipation wave forms in a given transistor in oscillator circuits of one type of prior art circuit.
Figure 6:
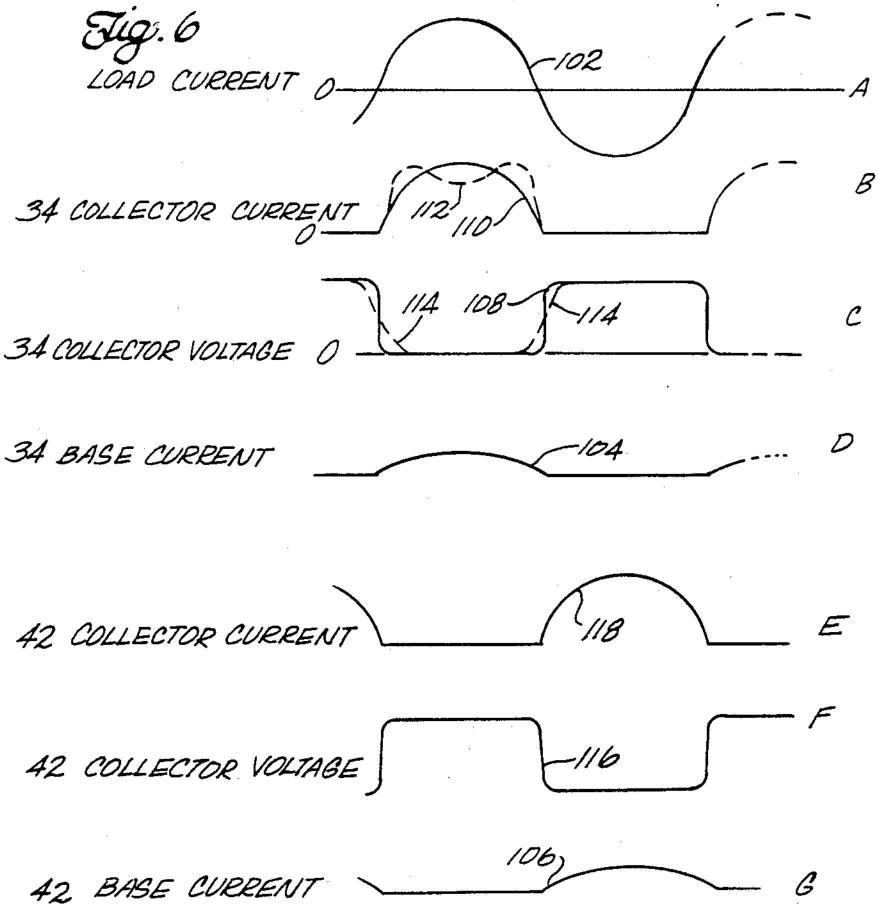
FIG. 6 shows voltage and current wave forms for the circuits of FIGS. 3 and 4.

The advantages and benefits afforded by the present invention will be better understood by first comparing the operation of a typical self-excited push-pull driven oscillator, without filters, the wave forms for which are depicted in FIG. 5, with the operation of a circuit embodying the present invention, the wave forms for which are depicted in FIG. 6.

The operation of such a prior art device as depicted in FIG. 5, ideally has a voltage wave form across the emitter to collector electrodes of the transistor as depicted at 94 in wave form Vc (FIG. 5A) and has a collector to emitter current as depicted at 98 in wave form Ic (FIG. 5B). Actually, the waveforms have a finite transition time from one level to the other, and therefore, the actual collector voltage waveform is as depicted at 96 and the collector current waveform is as depicted at 100.

Comparing the wave forms at Vc and Ic, it will be seen that during the time that voltage across the collector to emitter electrode is switched between zero and its peak value, there is a substantial period of time, represented by the intervals 97, during which either the voltage or the current is appreciable. As a result, substantial power is dissipated during this time period when both the collector voltage and the collector current are nonzero, as represented at 101 in the waveform Pdis (FIG. 5*c*). Similarly, the current flowing into the base of the transistor (not shown in FIG. 5) increases typically as shown for the collector to emitter current (Ic) and, therefore, power is also dissipated because of the flow of current in the base electrode while substantial voltage exists across the collector to emitter electrode circuit. Because of the substantial power dissipation, it is usually necessary to select very expensive transistors capable of dissipating substantial amounts of power if it is desired to operate the oscillator at high frequencies, in the order of 1 megahertz. Further, it is difficult to find transistors capable of handling the high power dissipation required for operation in the 1 megahertz range. Additionally, a device containing such transistors requires special design considerations for the dissipation of heat, for example.

Consider now the operation of the present invention as depicted in FIG. 6. FIG. 6A depicts a pure sinusoidal current waveform 102 representing the load current flowing through the series coupled crystal 30, filter circuit 58, and primary winding 72. The COLLECTOR CURRENT in transistor 34 is one-half of the pure sine wave 102 because of the polarity of feedback transformer 74. Furthermore, the COLLECTOR CURRENT is proportional to the current flowing in the base circuit 40 which is also half of a pure sine waveform due to feedback transformer 74. The current flowing in the base circuit is depicted at 104 as 34 BASE CURRENT (FIG. 6D).

The voltage wave form for the collector to emitter electrode circuit of transistor 34 is depicted at 34 COLLECTOR VOLTAGE. The ideal wave form is depicted by the solid line 108, whereas the actual wave form is depicted by the broken line 114. The time for the transition in voltage in exaggerated for purposes of explanation.

Significantly, neither the COLLECTOR CURRENT nor the BASE CURRENT will increase by any substantial amount prior to the time that COLLECTOR VOLTAGE reaches zero, i.e., during the time interval 97. As a result, very little power dissipation occurs either in the collector to emitter electrode circuit or in the base to emitter electrode circuit.

However, if there were any harmonics in the COLLECTOR CURRENT, such as that depicted by the broken line waveform 112, substantial amounts of COLLECTOR CURRENT would flow part of the time before the COLLECTOR VOLTAGE reaches zero and would result in substantial power dissipation in the transistor.

Similar comments apply to the other transistor 42.

Significantly, other advantages and features exist in the present invention. By way of example, the series current flowing through the crystal 30 also flows back through the filter circuit 58 to the feedback transformer 74. When the crystal is applied to a patient's body, the crystal is loaded which causes an increase in the resistance presented by the crystal and, hence, an increase in power output for a given current. Any tendency to change the magnitude of the current is fed back through the feedback transformer 44, thereby causing the transistors to continue operating in the most efficient mode by providing the required current to maintain the operation of the crystal 30 as discussed below. Because the series current through the cyrstal 30 is also fed back to the transistors, a single filter circuit is required to filter out all but the fundamental frequency of oscillation, both from the load current and the feedback current. Also, any change in the phase of the load current due to a change in the loading of the crystal is followed by a like change in phase in the feedback current.

As an example of the benefits resulting from the present embodiment, the ratio of the measured DC input to measured AC radio frequency output going to the transducer was determined and the efficiency was found to be consistently greater than 90%. This result is because the collector current at switchover time is minimized when the collector voltage is the greatest. Similarly, the collector current is maximized when the collector voltage is at a minimum.

Operation of the switching transistors, as described, results in the ability to provide high frequency output and means that transistor storage time is relatively unimportant. Furthermore, since the base drive current to a given transistor gradually goes to zero as switching time of the given transistor approaches, the base charge storage is reduced, allowing higher efficiency.

Operation at series resonance enable attainment of relatively high power output at a relatively low voltage applied to the crystal.

It should be noted that the above embodiment is a preferred configuration, but others are foreseeable. The described embodiment of the invention is only considered to be preferred and illustrative of the invention concepts; the scope of the invention is not to be restricted to such embodiment. Various and numerous other arrangements may be devised by one skilled in the art without departing from the spirit and scope of the invention. For example, as described above, PNP transistors can be used in place of NPN transistors with appropriate changes in voltage polarities, etc. Furthermore, the concepts disclosed with respect to the above-described embodiment can be effectuated with field effect transistors. Basically, field effect transistors are voltage-dependent and the oscillator circuit 33 and transducer circuit 52 can be designed, for example, such that the load circuit supplies a voltage signal filtered by an appropriate filter circuit to a feedback transformer for supplying a voltage signal to the control elements of the field effect transistors.

It may be desirable to put a capacitor in parallel with the crystal 30 in order to shunt any very high frequency signals to ground. Similarly, means can be provided in the feedback circuit for sensing the series current signal therein for providing a signal to a power output indicator. Additionally, the signal sensed from the feedback circuit can be used to provide a feedback signal to the positive transistor power supply in order to increase or decrease the output power of the device according to whether the crystal is loaded or unloaded, respectively. The signal is used to provide feedback in order to maintain constant current to the crystal irrespective of load. Methods of obtaining constant current derived from the current signal in the feedback circuit are well known in the art.

It might be desirable to include an overload circuit in the oscillator circuit in order to provide a shunt for any power surges to ground. This may be done by any means commonly known in the art.

Such a circuit can also be used in other ultrasound applications, for example, ultrasonic cleaners and cell disruptors. Though the power requirements are different, the same concepts herein disclosed apply for decreasing the power dissipation and increasing the efficiency.

TABLE I

Typical Component Values

| | |
|---|---|
| Transistors 34, 42 | D44C10 |
| Piezoelectric crystal 30 | Barium titanate cobalt, 1.0 Megahertz resonance |
| Output transformer 60 | Turns ratio: primary 14/14: secondary 16 |
| Filter capacitor 70 | Approximately 1500 Pico-Farad (fixed) + 600 pF (variable) |
| Filter inductor 68 | 14 microHenries |
| Phase shifting inductor 90 | 0.2 microHenry (approx.) |
| Phase shifting capacitor 92 | 0.22 microFarad |
| Feedback transformer 74 | Turns ratio: primary 1: secondary 10/10 |
| First startup resistor 80 | 100 ohms |
| Startup diode | IN 4148 |

TABLE I-continued

| Typical Component Values | |
|---|---|
| Capacitor 78 | 0.022 microFarad |
| Second startup resistor | 3.6 kohm |
| Impedance matching inductor 88 | 9 microHenries |

What is claimed is:

1. A high frequency, high mechanical energy output apparatus comprising:
   - a transducer having a fundamental frequency of oscillatory movement;
   - a driving circuit for driving the transducer comprising first and second active devices, each having an output circuit and a control circuit, the active devices being cooperatively connected together and responsive to control signals at the control circuits for producing an alternating output;
   - means for coupling the alternating output from the output circuits of the active devices to the transducer and adapted for applying the alternating output as an alternating series current signal serially through the transducer;
   - a filter circuit coupled together in series circuit relation with the transducer and operative for filtering, from the alternating series current signal, substantially all harmonics of the fundamental frequency of oscillation of the transducer to produce a filtered series current signal; and
   - means for coupling the filtered series current signal to the control circuits of the active devices for controlling respective ones of the first and second active devices and thereby cause the active devices to cooperatively enable said alternating output to be formed with a frequency substantially at the fundamental frequency.

2. The apparatus as claimed in claim 1 wherein the first and second active devices are transistors comprising respective collector-emitter circuits and respective base-emitter circuits such that the respective output circuit includes the respective collector-emitter circuit and the respective control circuit comprises the respective base-emitter circuit, annd wherein each active device is either in an OFF mode or in an ON mode.

3. The apparatus as claimed in claim 2 wherein the transistors are cooperatively connected in a push-pull circuit arrangement and wherein the alternating output of the cooperatively connected transistors has a squarewave voltage.

4. The apparatus as claimed in claim 1 wherein the first recited coupling means comprises a transformer operating in its linear range.

5. The apparatus as claimed in claim 4 wherein the transformer is coupled to the transducer.

6. The apparatus as claimed in claim 5 wherein the transducer conducts the filtered series current signal.

7. The apparatus as claimed in claim 1 wherein the means for coupling the filtered series current signal comprises a feedback transformer operating in its linear range.

8. The apparatus as claimed in claim 7 wherein the filtered series current signal has a first amplitude and the feedback transformer has a windings ratio such that the filtered series current signal is transformed to a control circuit current having a second amplitude such that an active device driving requirement for the first and second active devices is maintained, and the second amplitude is less than the first amplitude.

9. The apparatus as claimed in claim 8 wherein the filter circuit is coupled in series circuit relation with the transducer and the first recited coupling means between the first recited coupling means and the feedback transformer.

10. The apparatus as claimed in claim 9 wherein the filter circuit comprises a series connected inductance-capacitance resonant circuit.

11. Apparatus as claimed in claim 1 wherein the transducer is characterized for increasing an impedance presented to the alternating series current signal upon application of a mechanical load; and wherein the alternating series current signal has an amplitude and the second recited coupling means is responsive to a tendency to change the alternating series current signal amplitude for changing an amplitude of the control signals in the form of current to the control circuits of the active devices and thereby maintaining an amplitude of the alternating output of the active devices.

12. The apparatus of claim 1 wherein the driving circuit is a push-pull circuit, wherein the active devices are switching transistors of the NPN type, wherein a first transistor operates 180° out of phase with a second transistor such that one transistor is nonconducting while the other transistor is conducting for producing a squarewave voltage output signal and wherein the alternating series current signal is a sinusoid.

13. The apparatus as claimed in claim 12 wherein the transistors are rated to operate at approximately 100 KHz, and wherein the driving circuit produces an output signal at a frequency of substantially 1 MHz.

14. The apparatus as claimed in claim 12 wherein the filtered series current signal constituting the control signal is substantially in phase with operation of the transistors such that current in a given control circuit of a given transistor is approximately zero when the given transistor is switching between the conducting and nonconducting mode.

15. The apparatus as claimed in claim 14 wherein the current in the given control circuit has a first waveform, and current in the output circuit of the given transistor has a second waveform such that the first and second waveforms are the same, but where an amplitude of the current in the given control circuit is less than an amplitude in the output circuit.

16. The apparatus as claimed in claim 12 wherein the means for coupling the filtered series current signal to the control circuits of the active devices is a current feedback transformer operating in a linear region of the transformer.

17. The apparatus as claimed in claim 16 wherein the feedback transformer comprises a turns ratio such that a current signal on a secondary of the feedback transformer is of the same waveform as the filtered series current signal and wherein the filtered series current signal has an amplitude, at most, to maintain a rated gain of the transistor.

18. The apparatus as claimed in claim 17 wherein the transistor comprises a rated gain of about 10:1 and wherein the turns ratio is about 1:10.

19. The apparatus as claimed in claim 1 further comprising inductance means coupled in parallel with the transducer.

20. A high energy output ultrasonic patient therapy apparatus comprising:

an applicator comprising a piezoelectric crystal for applying mechanical vibratory energy to a patient's body; and an electrical driving circuit for driving the piezoelectric crystal and comprising:

first and second active devices, each having an output circuit and a control circuit, each active device being operatively coupled in the circuit for sequentially switching, out of phase with the other active device, between an ON condition, for conducting current through the output circuit, and an OFF condition for inhibiting the flow of such current;

means for coupling the current flowing through the output circuits of both the first and second active devices to the crystal for thereby applying an alternating series current signal serially through the crystal for energizing the crystal;

means for coupling the series current signal which is passing through the crystal back to the control circuits of the first and second active devices for enabling the series current signal to alternately switch the active devices between their ON and OFF conditions; and a filter circuit for filtering, from the series alternating current signal which is passing through the piezoelectric crystal and which is being fed back to the control circuits of the first and second active devices, substantially all harmonics of the fundamental frequency of oscillation of the piezoelectric crystal to thereby minimize the power dissipation in the first and second transistors and in the piezoelectric crystal.

21. Apparatus according to claim 20 wherein the active devices each comprise a transistor having an output electrode comprising the output circuit and an input electrode comprising the input circuit.

22. Apparatus according to claim 21 wherein the filter circuit comprises a series inductance-capacitance circuit.

23. Apparatus according to claim 21 wherein the first and second transistors are connected in a push-pull circuit relation to the crystal.

24. Apparatus according to claim 21 wherein the first recited means comprises a transformer having at least one primary winding coupled to the output electrodes of the first and second transistors and at least one secondary winding serially coupled to the crystal.

25. Apparatus according to claim 24 wherein the first and second transistors each have further electrodes, and current passes through each transistor between the output electrode and the further electrode, and comprising means for coupling the further electrode of each transistor to a common source of potential.

26. Apparatus according to claim 25 comprising means for coupling a point in the primary winding which is between the ends of the primary winding to a further source of potential.

27. Apparatus according to claim 25 wherein the second recited means for coupling comprises a transformer having a primary winding coupled for serially receiving the series current flowing through the crystal and a secondary winding having a first output coupled to the control electrode of the first transistor, a second output coupled to the control electrode of the second transistor, and a third output coupled to the common source of potential.

28. A high energy output ultrasonic patient therapy apparatus comprising:

an applicator comprising a transducer for applying mechanical vibratory energy to a patient's body; and an oscillator circuit for driving the transducer and comprising:

first and second active devices, each having an output circuit and a control circuit, the first and second active devices being operatively connected and responsive to control signals at their control circuit for providing an alternating current signal at the output circuits;

means for coupling the current flowing through the output electrodes of both the first and second transistors to the transducer for thereby applying an alternating series current signal serially through the transducer for energizing the transducer;

means for coupling the series current signal which is passing through the transducer back to the control electrodes of the first and second transistors for enabling the series current signal to alternately switch the transistors between their ON and OFF conditions; and a filter circuit for filtering, from the series alternating current signal which is passing through the transducer and which is being fed back to the control electrodes of the first and second transistors, substantially all harmonics of the fundamental frequency of oscillation of the transducer to thereby minimize the power dissipation in the first and second transistors and in the transducer.

29. Apparatus as claimed in claim 28 wherein the transducer is characterized for increasing an impedance presented to the alternating series current signal upon application of a mechanical load; and wherein the alternating series current signal has an amplitude and the second recited coupling means is responsive to a decrease in the alternating series current signal amplitude for decreasing an amplitude of the control signals in the form of current to the control circuits of the active devices and thereby cause a decrease in an amplitude of the output signal of the active devices.

30. Apparatus according to claim 28 wherein the transducer has an equivalent electrical circuit substantially equivalent to an inductance connected to a capacitance.

* * * * *